United States Patent
Glenn et al.

(10) Patent No.: US 6,586,826 B1
(45) Date of Patent: Jul. 1, 2003

(54) INTEGRATED CIRCUIT PACKAGE HAVING POSTS FOR CONNECTION TO OTHER PACKAGES AND SUBSTRATES

(75) Inventors: Thomas P. Glenn, Gilbert, AZ (US); Steven M. Anderson, Chandler, AZ (US); Steven Webster, Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/881,344

(22) Filed: Jun. 13, 2001

(51) Int. Cl.[7] .................. H01L 23/02; H01L 23/48; H01L 23/34; H05K 1/18; H05K 1/14
(52) U.S. Cl. .................. 257/686; 257/777; 257/723; 257/685; 257/778; 257/737; 257/738; 257/642; 257/643; 257/698; 257/712; 361/414
(58) Field of Search .................. 257/686, 685, 257/777, 723, 692, 693, 698, 702, 737, 738, 734, 778, 784, 786, 787, 712; 361/414

(56) References Cited

U.S. PATENT DOCUMENTS

| | | | |
|---|---|---|---|
| 4,620,757 A | 11/1986 | Thevenaz | 339/17 C |
| 4,654,472 A | 3/1987 | Goldfarb | 174/52 R |
| 5,104,480 A | 4/1992 | Wojnarowski et al. | 156/643 |
| 5,158,465 A | 10/1992 | Zaderej et al. | 439/55 |
| 5,220,489 A | 6/1993 | Barreto et al. | 361/400 |
| 5,222,014 A * | 6/1993 | Lin | 257/712 |
| 5,399,104 A | 3/1995 | Middlehurst et al. | 439/608 |
| 5,523,628 A * | 6/1996 | Williams et al. | 257/777 |
| 5,579,207 A | 11/1996 | Hayden et al. | 361/790 |
| 5,783,870 A * | 7/1998 | Mostafazadeh et al. | 257/777 |
| 5,831,832 A * | 11/1998 | Gillette et al. | 257/778 |
| 6,013,948 A * | 1/2000 | Akram et al. | 257/698 |
| 6,029,882 A * | 2/2000 | Bolde et al. | 228/254 |
| 6,093,029 A | 7/2000 | Kwon et al. | 439/69 |
| 6,297,548 B1 * | 10/2001 | Moden et al. | 257/686 |
| 6,395,582 B1 * | 5/2002 | Sohn et al. | 438/111 |
| 6,396,143 B1 * | 5/2002 | Kimbara et al. | 257/738 |

* cited by examiner

Primary Examiner—Alexander O. Williams

(57) ABSTRACT

Integrated circuit packages that may be easily stacked one on top of the other are disclosed. The package includes a molded plastic body having metal-coated interconnection posts on both its upper and lower surfaces. An integrated circuit is mounted on the upper surface. Metal traces on the upper surface electrically connect each bonding pad on the integrated circuit to a one of a plurality of groups of four interconnection posts on the upper surface. Vias through the substrate electrically connect each group of four posts on the upper surface to an interconnection post on the lower surface of the package. Two or more packages can be stacked and electrically connected by wedging the lower posts of a top package between each group of four posts on the upper surface of a lower package. The lower posts of the lower package may be soldered to a conventional printed circuit board, or may be mounted on a mounting substrate that also has corresponding groups of four interconnection posts.

36 Claims, 5 Drawing Sheets

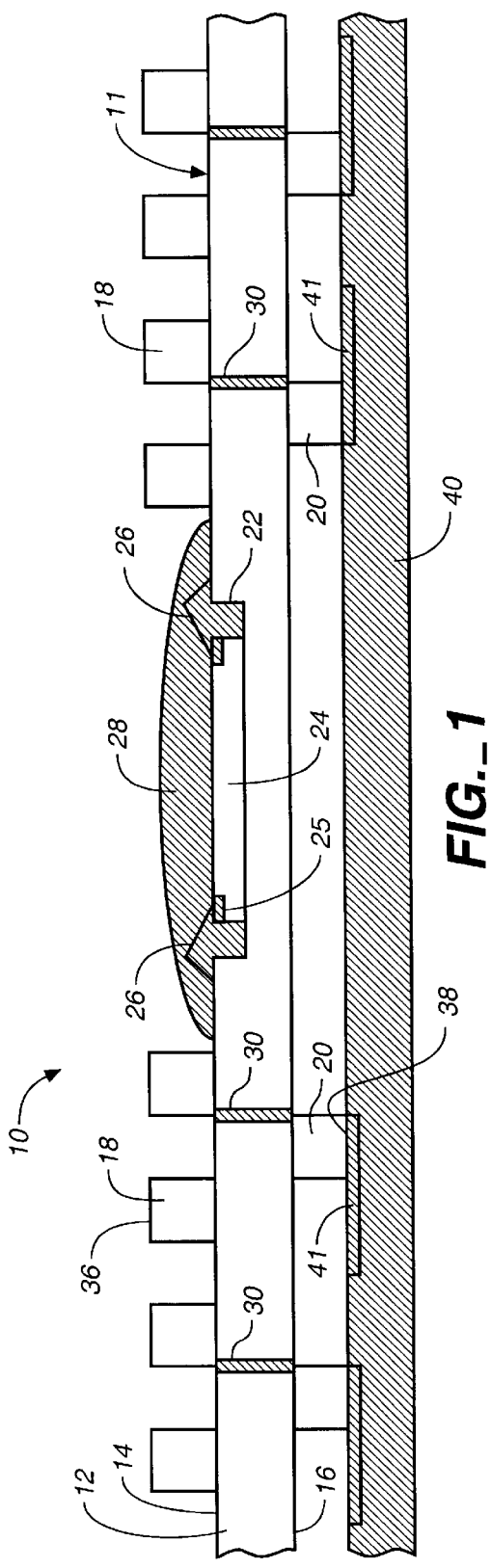
FIG._1
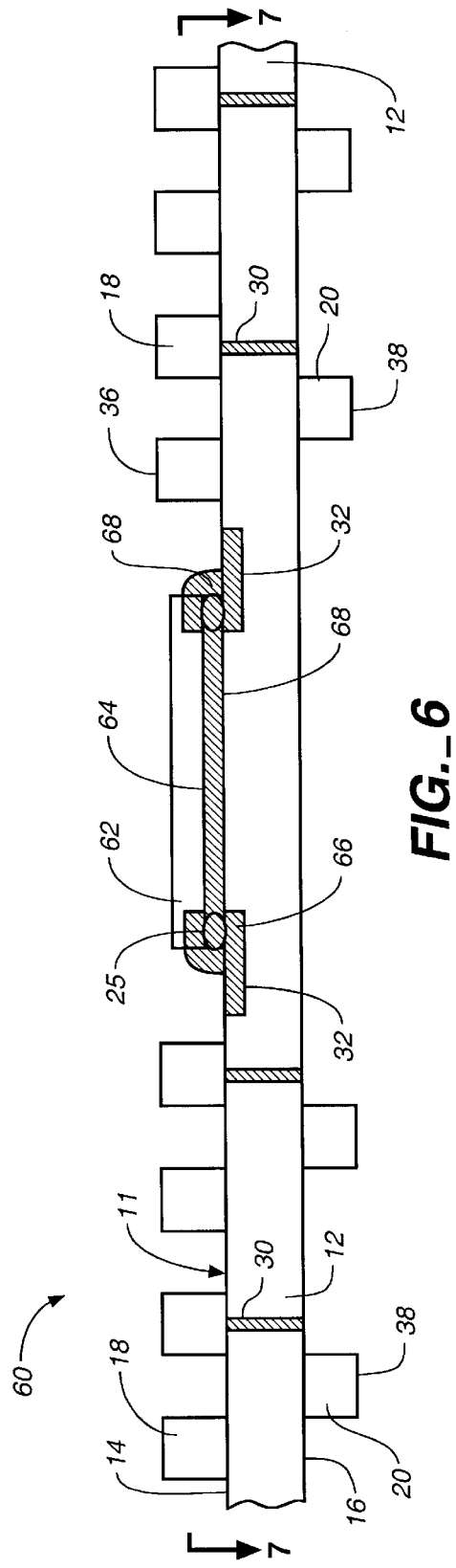
FIG._6

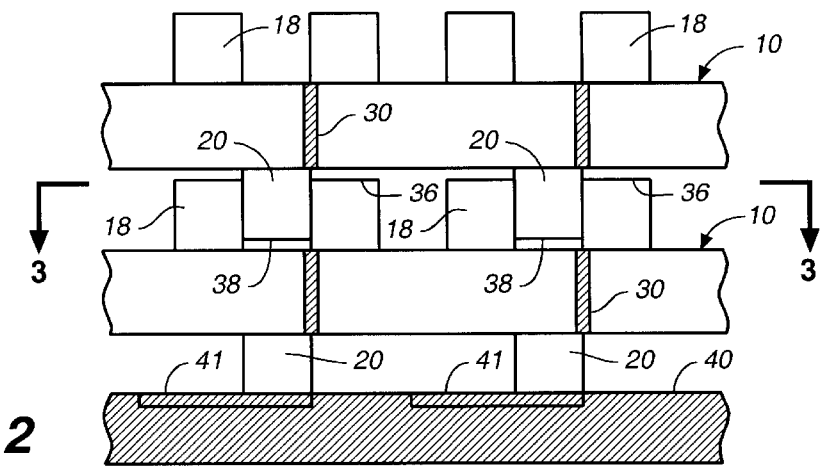
FIG._2
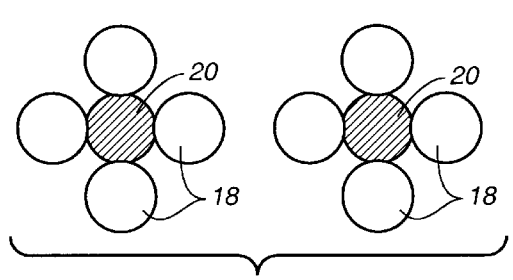
FIG._3A
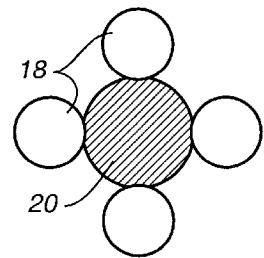
FIG._3B
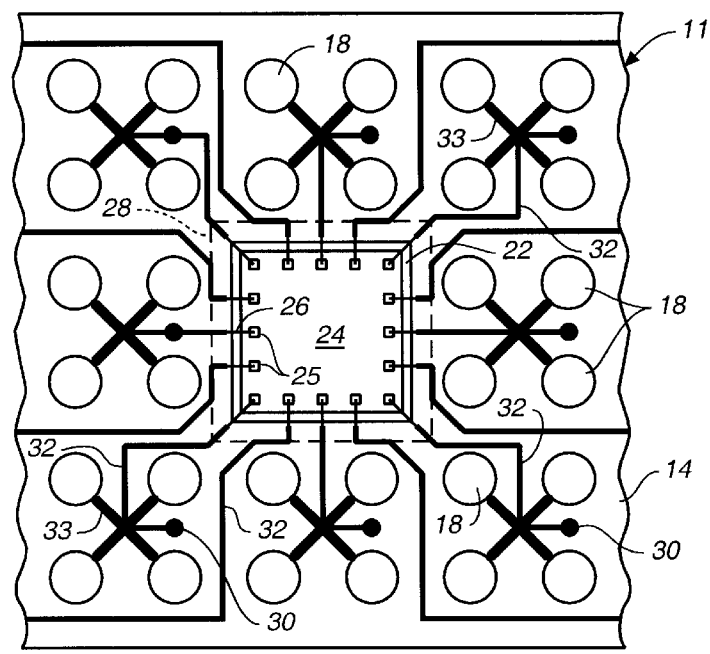
FIG._4

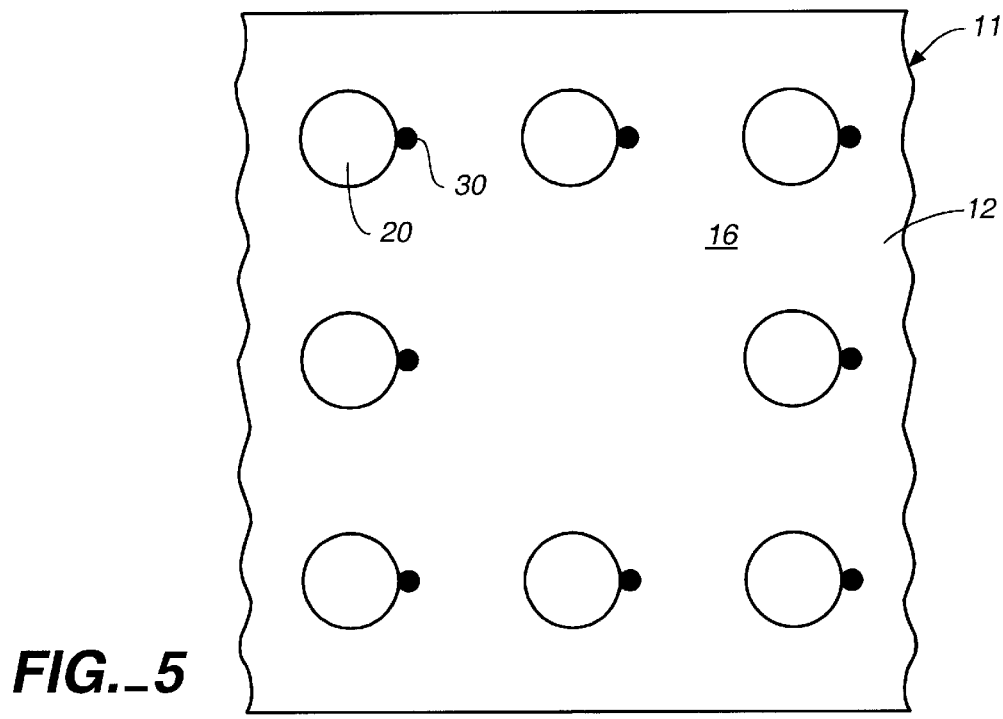
FIG._5
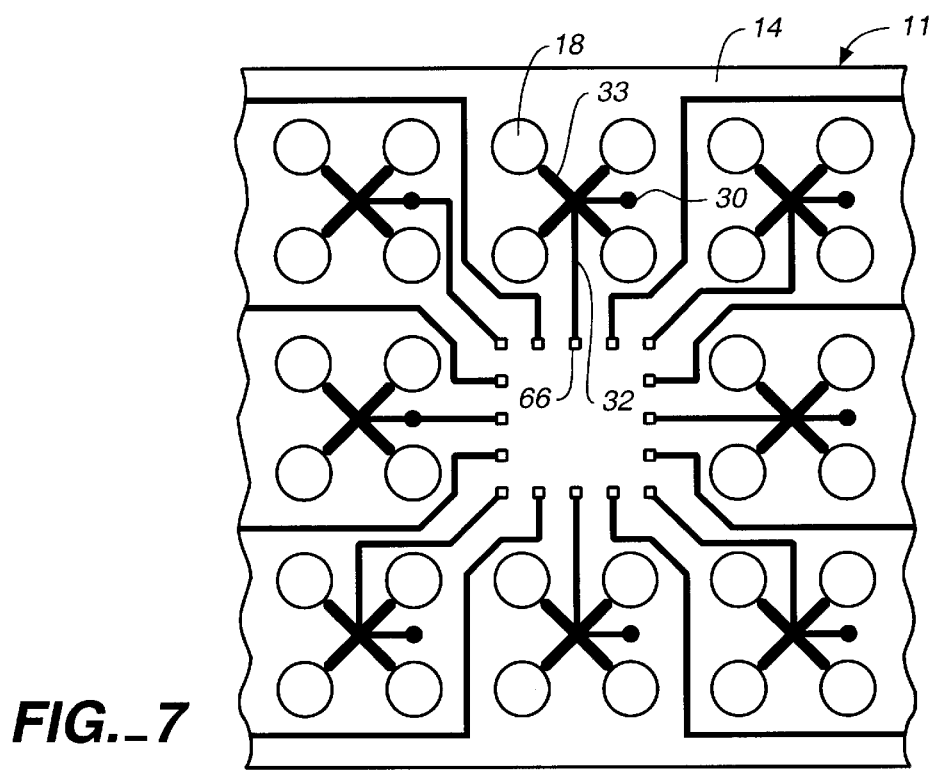
FIG._7

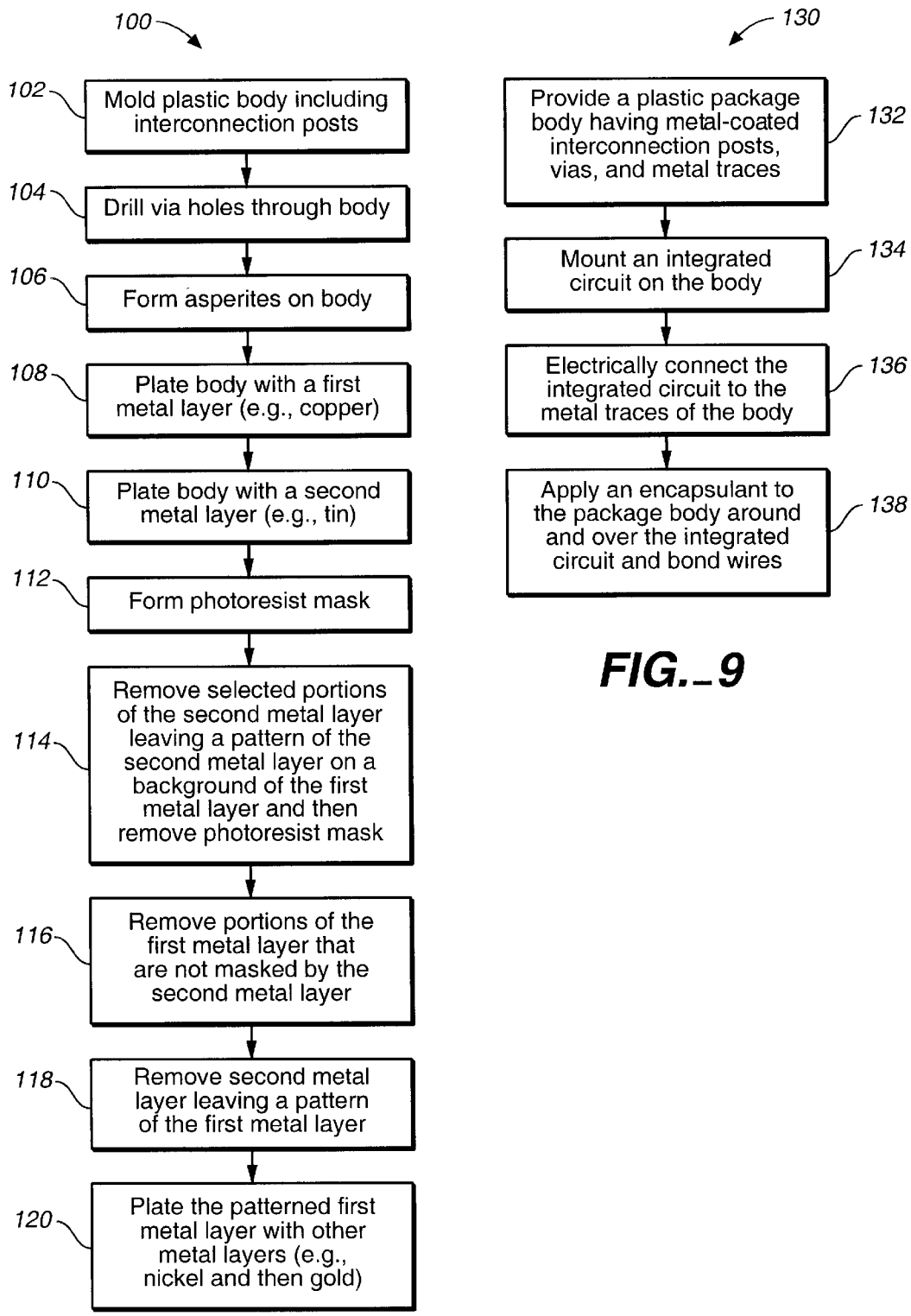

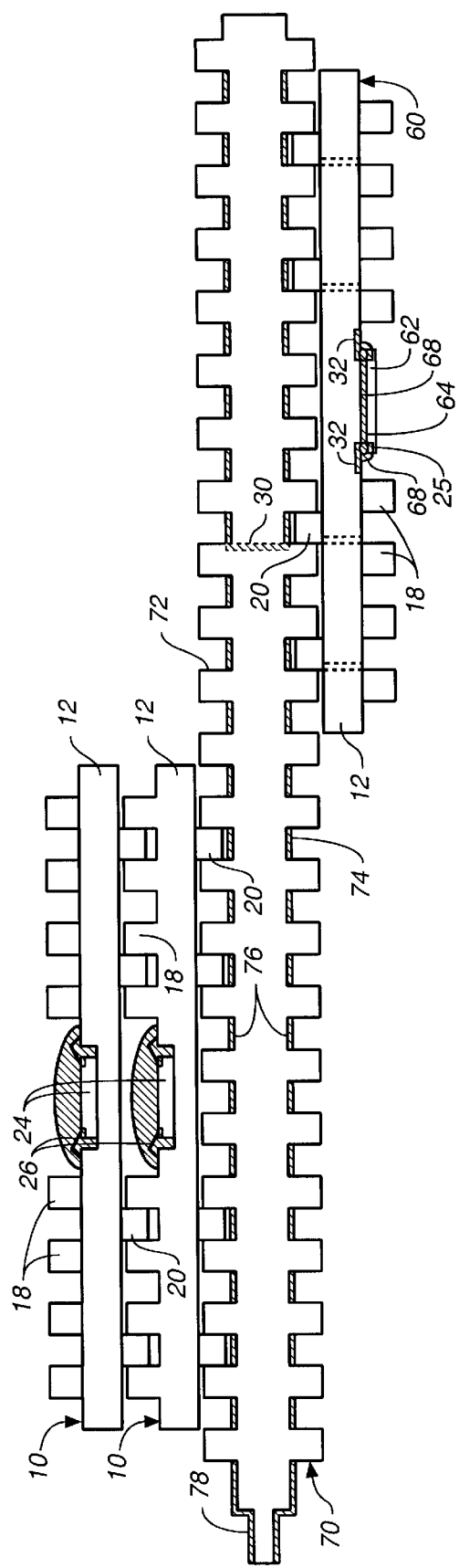
FIG._10

INTEGRATED CIRCUIT PACKAGE HAVING POSTS FOR CONNECTION TO OTHER PACKAGES AND SUBSTRATES

BACKGROUND OF THE INVENTION

In the field of integrated circuit packaging, it is known to include a plurality of integrated circuits in a single package body. Providing a plurality of integrated circuits in one package allows an increase in package density without a significant increase in the area of the printed circuit board that is consumed by the package.

A problem with conventional packages, even packages that contain a plurality of integrated circuits, is that further increases in density per unit area of the printed circuit board are not easily attainable. So, for example, if a package includes two sixteen megabit memory integrated circuits (total thirty-two megabits), then increasing the total amount of memory to 128 megabits would require three additional packages, each of which would require additional mounting area on the printed circuit board. Artisans have attempted to stack separate packages on top of each other to avoid increases in mounting area, but such stacking methods can be difficult and time consuming.

SUMMARY OF THE INVENTION

The present invention includes an integrated circuit package that may be easily stacked upon another similarly-constructed package so as to form an electrical and physical connection with the other package. The stacked packages may contain the same or different types of integrated circuits. For example, two memory packages may be stacked or a memory package may be stacked with a microprocessor package. The package design provides the user with flexibility in deciding how many and what types of packages to stack.

One embodiment of the present invention includes a substrate for making an integrated circuit package. The substrate includes a molded plastic body having an integrated circuit mounting region and a plurality of integral plastic posts extending vertically from body. The posts may include first posts extending from a first side of the body and second posts extending from an opposite second side. The posts are coated with metal. The body also includes electrically conductive paths, which may include metal traces on the body and metal vias through the body, that are electrically connected to the metal coating of the posts.

The present invention also includes a method of making an integrated circuit package using the above substrate, and the integrated circuit package made thereby. An integrated circuit (e.g., a memory, microprocessor, or optical chip, or a micromachine) is mounted in the chip mounting region of the substrate. The integrated circuit is electrically connected to the metal coating of the posts through the electrically conductive paths of the substrate. For example, in an embodiment where first and second posts are provided on opposing sides of the package body, an integrated circuit mounted on the first side of the body may be electrically connected by bond wires to metal traces on the first side of the body, which traces are electrically connected to the metal coatings of the first posts and to vias through the body that are electrically connected to the metal coatings of the second posts.

Another embodiment of the present invention includes a stack of integrated circuit packages. The stack includes at least two of the above-described packages one on top of the other. The posts of one package are engaged with the posts of the other package so that their respective metal coatings contact each other, thereby forming an electrical connection between the packages.

The present invention also includes a method of stacking the above-described packages. In one embodiment, the method includes inserting each second post of one of the packages into a space between a group of first posts of another package so that each second post is physically connected to the respective group of first posts and is electrically connected to at least some of the first posts of the respective group.

Another embodiment of the present invention includes a method for making the above described substrate. The method includes molding a plastic package body having vertically extending plastic posts. The posts are then coated with metal. Vias may be formed through the substrate, by, for example, drilling holes through the body and filling the holes with metal. Metal traces also are formed on the body and are electrically connected to the vias and the metal coatings on the posts.

Another embodiment of the present invention includes a mounting substrate upon which the above-described integrated circuit packages may be easily mounted. The mounting substrate includes a molded plastic sheet having a plurality of integral plastic posts extending vertically from at least one side of the sheet. All or some of the posts are coated with metal. The posts are arranged in groups, with each group including a plurality of posts. A space is between the posts of each group. The posts are sized and arranged so that a metal-coated post of an integrated circuit package may be inserted snugly into the space between the posts of some of the groups of posts on the mounting substrate, thereby forming an electrical connection through contact between the metal coatings of the respective posts. An electrically conductive connector (e.g., an edge connector) is included on the mounting substrate. At least some of the groups of posts of the mounting substrate are electrically connected to the connector, which allows the integrated circuit packages mounted on the mounting substrate to be electrically connected to external circuitry.

These embodiments and other aspects of the present invention will be further described in the detailed description below and in the accompanying figures.

BRIEF DESCRIPTION OF THE DRAWINGS

FIG. 1 is a cross-sectional side view of a stackable integrated circuit package.

FIG. 2 is a cross-sectional side view of portions of two of the packages of FIG. 1 stacked one on top of the other.

FIG. 3A is sectional view of the stacked packages of FIG. 2 along line 3—3.

FIG. 3B is an sectional view of alternative package posts, where the diameter of each of the four upper posts is smaller than the diameter of the lower post engaged therewith.

FIG. 4 is a top plan view of a central portion of the package of FIG. 1.

FIG. 5 is a bottom plan view of a central portion of the package of FIG. 1.

FIG. 6 is a cross-sectional side view of a central portion of an alternative stackable integrated circuit package for a flip chip style integrated circuit.

FIG. 7 is top plan view of the substrate of the package of FIG. 6 taken along line 7—7.

FIG. 8 is a flow chart of a method of making a substrate that may be used for making a package of the present invention.

FIG. 9 is a flow chart of a method of making a package using the substrate formed by the method of FIG. 8.

FIG. 10 is a cross-sectional side view of a mounting substrate upon which packages like those of FIGS. 1 and 6 may be mounted.

DETAILED DESCRIPTION OF THE EXEMPLARY EMBODIMENTS

FIG. 1 is a cross-sectional side view of a stackable integrated circuit package 10 in accordance with one embodiment of the present invention. The design of package 10 enables a plurality of packages 10 to be physically and electrically interconnected in a stack on a printed circuit board.

Package 10 includes a substrate 11 upon which an integrated circuit 24 is mounted. Substrate 11 includes a molded plastic body 12. Body 12 may be formed by an injection molding method using liquid crystal polymer ("LCP") material or some other plastic material. The material selected for body 12 should be able to withstand the temperatures of conventional solder reflowing operations.

Body 12 includes an upper side 14 and an opposite lower side 16. A plurality of precisely-sized, precisely-located, plastic interconnection posts 18 and 20 that project vertically from upper side 14 and lower side 16, respectively, of body 12. Posts 18, 20 are formed of the same material as body 12 and are integral therewith. The size of body 12 (e.g., the area of upper side 14 and lower side 16 and the thickness of body 12) will vary with the application. Posts 18, 20 are coated with metal.

Upper posts 18 are arranged in groups of four posts 18, with a precisely-sized space between inner side walls of the four posts 18 of each group (FIG. 4). There is one lower post 20 for each group of four upper posts 18. The number posts 18, 19 will vary with the number of bond pads 25.

The vertically-extending sidewalls of posts 18 and 20 may be orthogonal. Alternatively, the sidewalls of posts 18 and 20 may be provided with a small negative draft. That is, posts 18 and 20 may be slightly smaller in diameter (e.g., 0.005 mm) at sides 14 and 16, respectively, of body 12 than at their free ends 36 and 38, respectively.

Integrated circuit 24 is mounted in a rectangular depression 22 in upper side 14 of body 12. A conventional die attach adhesive, such as epoxy, may be used to attached integrated circuit 24 to body 12.

Referring to FIGS. 1 and 4, a hardened glob of encapsulant 28 on upper side 14 fills depression 22 and covers integrated circuit 24, bond wires 26, and the connections between body wires 26 and traces 32. Encapsulant 28 is insulative and protects integrated circuit 24 from the environment. Encapsulant 28 may be Hysol☐ 4450 or 4423 encapsulants from the Dexter Hysol Company of City of Industry, Calif. or some other conventional encapsulant. Encapsulant 38 may be omitted, depending on the application.

FIG. 4 shows that integrated circuit 24 includes sixteen bond pads 25, each of which is electrically connected by a bond wire 26 to an electrically conductive path of substrate 11 of package 10. In this instance, the electrically conductive paths include metal traces 32 on first side 14 of body 12 and metal vias 30 that extend vertically through body 12 from upper side 14 to lower side 16. Each bond wire 26 is electrically connected between a bond pad 25 and a first end of a metal trace 32. The opposite end of each trace 32 splits into five traces 33. One trace 33 electrically connects the respective trace 32 to a via 30, and four other traces 33 electrically connect the respective trace 32 to the metal coatings of the four upper posts 18 of a group of posts 18. In an alternative embodiment, instead of having five traces 33, the entire area of the first side between the four posts 18 of a group and out to the respective via 30 may be coated with a splotch of metal that is electrically connected to the respective trace 32.

FIG. 5 is a plan view of lower side 16 of package body 12. At lower side 16, each via 30 is electrically connected to a base portion of the metal coating of a lower post 20. Thus, each bond pad 25 of integrated circuit 24 is electrically connected to the metal coatings of four posts 18 on first side 14 and to the metal coating of one post 20 on second side 16. In an alternative embodiment, the exposed lower end of each via 30 is displaced from the respective lower post 20, and a metal trace is provided on second side 16 that electrically connects the via to the metal coating of the respective lower post 20.

Referring back to FIG. 1, package 10 is mounted on a printed circuit board 40. Each lower post 20 is electrically connected by reflowed solder to a metal trace 41 on printed circuit board 40.

FIG. 2 shows portions of a stack of two packages 10, one on top of the other The two packages 10 are electrically and physically connected to each other. The lower package 10 is mounted on and electrically connected by solder to printed circuit board 40.

As shown in FIGS. 2 and 3A, each lower interconnection lower post 20 of the upper package 10 is snugly wedged into the space between four upper interconnection posts 18 of the lower package 10. The frictional metal-to-metal contact between the metal coatings of each lower post 20 of the upper package and the corresponding group of four upper posts 18 of the lower package 10 provides an electrical and physical connection between the two stacked packages 10. The tight engagement between the posts 18, 20 of the stacked packages 10 is enabled by precisely controlling the diameters and locations of upper posts 18 and lower posts 20. As shown by FIG. 3A, the diameter of upper posts 18 is equal to the diameter of lower posts 20, and the space between the facing inner sidewall portions of the posts 18 of each group of four posts 18 is equal to the diameter of the post 20 inserted therein.

In one embodiment, the diameter of posts 18, 20 and the distance between the four posts 18 of each group of posts 18 on first side 14 is 1.000 mm±0.01 mm. In another embodiment, those dimensions are 0.500 mm±0.005 mm. Where posts 18 and 20 are provided with a negative draft, an even tighter connection between each post 20 and group of four posts 18 is possible, because post 20 must be snapped into place between the posts 18 of the group.

FIG. 3B shows an alternative embodiment where the diameter of each of the four upper posts 18 is less than the diameter of the lower post 20 engaged therewith. However, the space between the facing inner sidewall portions of the posts 18 of FIG. 3B is still equal to the diameter of the post 20 inserted therein.

In the embodiment of FIG. 2, the ends 38 of lower posts 20 of the upper package 10 do not contact upper side 14 of lower package 10 to avoid short circuits. Similarly, ends 36 of upper posts 18 of the lower package 10 do not contact lower side 16 of the upper package 10. In an alternative embodiment, where an insulative material is applied over ends 36, 38 or on upper surfaces 14 between posts 18, there may be physical contact between ends 36, 38 and the superimposed package side 14 or 16.

In the stack of FIG. 2, the two packages would be electrically connected in parallel. Integrated circuit 24 may be, for example, a memory device, such as a DRAM or SRAM or flash memory device. Accordingly, the size of the memory could be increased by stacking additional packages 10 on top of the two packages 10 of FIG. 2.

In an alternative embodiment, packages having different types of integrated circuits 24 (e.g., a memory device and a microprocessor) but similar structures of substrate 11 could be stacked one on top of the other. The routing of traces 32 could be changed and additional metal traces could be provided on lower side 16 to accommodate the electrical interconnection of different types of integrated circuit packages.

The number of interconnection posts 18 and 20 on body 12 will vary depending on the number bond pads of the integrated circuit, and the selected ratio of upper interconnection posts 18 to lower interconnection posts 20, among other possible factors. As mentioned above, package 10 has a ratio of four upper posts 18 for every one lower post 20 (FIG. 3A). In an alternative embodiment, the ratio could be different, e.g. 3:1 or 5:1, but the strength of the frictional connection between the two joined packages may be expected to vary proportionally.

The number of posts 18, 20 that may be formed on body 12 is a function of the area of sides 14,16 of body 12; the diameter of posts 18, 20 and the dimension of the space between the four posts 18 of each group; and, the selected distance between the several groups of posts 18 on upper side 14, among other possible factors.

FIG. 6 provides a cross-sectional side view of a package 60 in accordance with another embodiment of the present invention. Some features of package 60 that are similar to features of package 10 of FIG. 1 have common reference numbers.

Package 60 of FIG. 6 includes a flip chip style integrated circuit, which is denoted as flip chip 62 herein. Flip chip 62 includes a first surface 64 with a plurality of electrically conductive bonding pads 25 thereon. Flip chip 62 is mounted on upper side 14 of body 12, which in this case is planar and lacks a depression 22. Flip chip 62 is mounted so that each bonding pad 25 on first surface 64 faces a corresponding metal land on upper side 14 of body 12. FIG. 7 shows upper surface 14 of body 12 of substrate 11 of package 60. Metal lands 66 are formed at the inner ends of traces 32. Bonding pads 25 of flip chip 62 of FIG. 6 are electrically connected by solder to lands 66. As with integrated circuit 24 of package 10 of FIG. 1, flip chip 62 is electrically connected by metal traces 32 and metal vias 30 to the metal coatings of posts 18, 20. An electrically insulative underfill material 68 is present around flip chip 62 and between first surface 64 of flip chip 62 and upper side 14 of body 12. Underfill 68 may be omitted. A glob of encapsulant may be applied over flip chip 62.

Package 60 of FIG. 6 is stackable, like package 10 of FIG. 1. A plurality of packages 60 may be placed one on top of the other to form a stack, as shown in FIG. 2. In addition, a package 60 may be stacked with a package 10.

A method 100 of making substrate 11 of packages 10 and 60 is illustrated in FIG. 8. Step 102 includes molding plastic body 12, including posts 18, 20. Depending on the embodiment, a depression 22 may be formed in upper side 14 of body 12 to receive an integrated circuit in a later step. A tight-tolerance injection molding technique may be used. The material of body 12 may be LCP or another insulative plastic material.

Step 104 drills holes through body 12 between upper side 14 and lower side 16. The holes are for forming vias 30. The holes may be drilled, for example, using a computer-controlled laser drill.

Step 106 forms numerous very small asperities on the surfaces of body 12 to aid in the attachment of a metal layer to body 12 in a subsequent metal plating step. One way to perform step 106 is to expose body 12 to a plasma that includes, for example, a fluorocarbon gas or some other fluorine gas.

Step 108 plates the entire surface of body 12 with a first metal layer, which in this example is copper, although other metals may also be used. This step also plates the holes through body 12 with copper so as to form vias 30. The copper may be plated onto body 12 using an electrodeless plating process. The asperities formed in step 106 help to hold the copper layer to body 12.

Step 110 plates body 12 with a layer of a second metal, which in this case is tin, although other metals may be used.

Step 112 forms a patterned photoresist mask on sides 14, 16 of body 12. The particular method of forming the photoresist mask may vary. In an example method, a photoresist material is applied to body 12 and then baked. Next, the photoresist material is exposed to light of a specified frequency through a reticle. The light exposes the photoresist. Subsequently, a developer is applied to the photoresist so that the nonexposed photoresist material may be removed, leaving a patterned hotoresist mask on body 12.

Step 114 etches the tin layer through openings in the photoresist mask using a liquid chemical etchant or a plasma etchant that are selective to copper. This step results in the formation of patterns of tin on a copper background. Tin remains on posts 18, 20 and in the areas where traces 32, 33 and the ends of vias 30 are desired. Conventional etch methods allow the formation of 0.01 mm wide tin lines and 0.01 mm wide spaces between the tin lines, although differently-sized lines and spaces may be used.

Step 116 removes the copper from all areas of body 12 that are not covered by the tin pattern. The tin acts as a mask during step 116. One method of removing the copper is to expose the exposed copper areas of body 12 to a laser. The laser is tuned so as to vaporize the copper without vaporizing the tin. After step 116, body 12 has metal coatings on posts 18, 20 and also has metal traces 32, 33 and vias 30. The metal includes a first layer of copper covered by a second layer of tin.

Step 118 removes the tin layer on body 12. The tin may be removed by chemical or plasma etching using an etchant that is selective to copper.

Step 120 optionally plates the remaining copper on body 12 with additional metal layers, such as an intermediate layer of nickel and a top layer of gold. Electrodeless plating is used. Nickel is used as an intermediate metal to facilitate the attachment of the gold to the copper. The friction between the gold layers on posts 18, 20 holds the stacked packages together (FIGS. 2 and 3A).

At the conclusion of step 120, substrate 11 is fully formed. Posts 18, 20 are coated with layers of copper, nickel, and gold. Traces 32, 33 are formed of layers of copper, nickel, and gold. Vias 30 also are metal filled.

A vendor of equipment believed to be capable of performing method 100 is Siemens Energy and Automation, Inc., which has offices in Germany; Austin, Tex.; and Atlanta, Ga.

A method 130 for making package 10 of FIG. 1 is illustrated in FIG. 9. Step 132 provides a substrate 11. Step 134 centrally mounts an integrated circuit 24 in depression 22 of upper side 14 of body 12 of substrate 11. If there is no depression 22, then integrated circuit 24 is centrally mounted on upper side 14. A conventional die attach adhesive or adhesive film may be used to attach integrated circuit 24 to body 12. Step 136 connects bond wires 26 between bond pads 25 of integrated circuit 24 and the inner ends of traces 32. Conventional bond wire materials (e.g., gold), wiring methods, and equipment may be used. Step 138 encapsulates die 22 by applying an insulative encapsulant material 28, such as Hysol® 4450 or 4423 encapsulant, onto upper side 16 so as to cover integrated circuit 24, bond wires 26, and the ends of traces 32. A glob top, liquid encapsulation, or molding method may be used to apply encapsulant 28.

Package 60 of FIGS. 6 and 7 may be made by a similar method. In such a method, bond pads 25 of flip chip 62 are directly mounted on lands 66 and electrically connected thereto by solder. Subsequently, underfill material 68 is applied onto upper side 14 around flip chip 62. Underfill material 68 wicks in under flip chip 62.

An alternative method of making substrate 11 and packages 10, 60 is to make a plurality of substrates 11 and packages 10, 60 in parallel. In such an embodiment, a molded sheet of plastic material consisting of an array of interconnected package sites is formed. Each package site of the sheet would be equivalent to a substrate 11 of FIGS. 1 and 6. Method 100 of FIG. 8 would be performed to form the sheet and each package site of the sheet. Next, method 130 of FIG. 9 or the flip chip mounting method discussed above would be performed in parallel for each package site of the sheet. Finally, the package sites of the sheet would be singulated so as to form individual packages 10, 60. One way to singulate assembled packages from the sheet would be to vertically cut through the sheet between the package sites using a saw or laser.

FIG. 10 provides a cross-sectional side view of a mounting substrate 70 that may be used in place of the conventional printed circuit board 40 of FIG. 1. Unlike the embodiments of FIGS. 1 and 2, where lower posts 20 of a package 10 were soldered to metal traces 41 of a printed circuit board 40, mounting substrate 70 includes metal-coated interconnection posts 18 like those on upper side 14 of body 12. In particular, mounting substrate 70 includes an upper side 72 and an opposite lower side 74. Sides 72, 74 each include numerous groups of four posts 18 and metal traces 76. An end of a trace 76 is electrically connected to one or more of the four posts 18 of each group of posts 18. The opposing end of some or all of the traces 76 may be electrically connected to metal terminals of an edge connector 78 on mounting substrate 70, which in turn may be inserted into an interconnection receptacle on a mother board or in an electronic chassis. Other traces 76 may electrically connect one group of posts 18 to another group of posts 18 so that packages or stacks of packages mounted on the same side 72 or 74 of mounting substrate 70 may be interconnected. Vias 30 may extend through substrate 70 so as to electrically connect traces 76 on the opposing sides 72, 74 so that packages or stacks of packages mounted on opposing sides of substrate 70 may be electrically connected. Accordingly, packages 10, 60 mounted on mounting substrate 70 may be electrically connected to each other, and may be electrically connected to external circuitry through connector 78.

When substrate 70 is used in place of printed circuit board 40, packages 10, 60 and stacks of packages 10, 60 may be directly mounted onto sides 72, 74, as shown in FIG. 10. The lower posts 20 of the lower package 10 or 60 of the stacks are engaged with, and thereby electrically connected to, some of the posts 18 of mounting substrate 70. Accordingly, there is no need for a soldered interconnection between mounting substrate 70 and packages 10, 60 mounted thereon. This give the user maximum flexibility and convenience in mounting various packages on mounting substrate 70, and also provides the capability of easily removing and replacing the packages.

The embodiments described above are merely examples of the present invention. Artisans may develop variations of these embodiments without departing from the spirit of the invention or the following claims.

What is claimed is:

1. A substrate for an integrated circuit package, the substrate comprising:

a plastic body having a plurality of metal-coated plastic posts each extending integrally from the body, and a region for mounting an integrated circuit; and a plurality of electrically conductive paths each electrically connected to the metal coating of at least one post wherein the plastic body has a first side and a second side, the region for mounting the integrated circuit is on said second side, the posts include first posts that extend integrally from the first side and second posts that extend integrally from the second side outside the region for mounting the integrated circuit, and at least some of the electrically conductive paths are electrically connected between the metal coating at least one first post and one second post.

2. The substrate of claim 1, wherein the electrically conductive paths include metal traces on one or both of the first and second sides of the body, and metal vias extending through the body.

3. The substrate of claim 2, wherein the vias are electrically connected between traces on the first and second sides of the body, the respective traces being electrically connected to the metal coating of the posts of the respective first or second side.

4. The substrate of claim 1, wherein the first posts are arranged in a plurality of groups, with each group including a plurality of first posts with space between the first posts of the group, and wherein the second posts are sized and located so that a second post of a similar substrate would snugly fit in each said space, thereby forming a metal-to-metal electrical connection with at least one of the first posts of the respective group.

5. The substrate of claim 4, wherein each group of first posts includes at least four first posts.

6. The substrate of claim 4, wherein the first posts and the second posts have equivalent diameters.

7. The substrate of claim 4, wherein the first posts have a diameter smaller than a diameter of the second posts.

8. An integrated circuit package comprising:

a plastic body having a first side, an opposite second side, and a plurality of metal-coated plastic posts each extending integrally from the body;

a plurality of electrically conductive paths each electrically connected to the metal coating of at least one post; and an integrated circuit mounted on the second side of the body and in an electrical connection with the metal coating of at least some of the posts through the electrically conductive paths, wherein at least some of said posts are on the second side of the body outward of said integrated circuit.

9. The package of claim 8, wherein the posts include first posts that extend integrally from the first side and second posts that extend integrally from the second side, and at least some of the electrically conductive paths are electrically connected between the metal coating of at least one first post and one second post.

10. The package of claim 9, wherein the electrically conductive paths include metal traces on one or both of the first and second sides of the body that are electrically connected to a post of the respective side of the body, and metal vias extending through the body.

11. The package of claim 9, wherein the first posts are arranged in a plurality of groups, with each group including a plurality of first posts with space between the first posts of the group, and wherein the second posts are sized and located so that a second post of a similar package would snugly fit in each said space, thereby forming a metal-to-metal electrical connection with at least one of the first posts of the respective group.

12. The package of claim 8, further comprising bond wires that are electrically connected between the integrated circuit and at least some of the electrically conductive paths.

13. The package of claim 8, wherein the integrated circuit is covered by an encapsulant material.

14. The package of claim 8, wherein the integrated circuit is a flip chip.

15. A stack of a plurality of integrated circuit packages, the stack comprising:

at least first and second integrated circuit packages, each said package having an integrated circuit mounted on a plastic body, said body having metal-coated plastic posts each extending integrally therefrom, wherein the integrated circuit of each package is electrically connected to the metal coating of at least some of the posts of the respective package, the first and second packages are stacked, and the posts of the first package are engaged with the posts of the second package, thereby forming a metal-to-metal electrical connection between the first and second packages.

16. The stack of claim 15, wherein for each package the plastic body has a first side and a second side, the posts include first posts extending from the first side and second posts extending from the second side, the first posts of the packages are arranged in a plurality of groups, with each group including a plurality of first posts with space between the first posts of the group, and wherein the second posts of one package are snugly inserted within the space between the first posts the groups of first posts of the other package.

17. A substrate for mounting one or more integrated circuit packages thereon, the substrate comprising:

a plastic sheet having a plurality of metal-coated plastic posts extending integrally from at least one side of the sheet, said posts adapted to engage like posts of said one or more integrated circuit packages;

an electrically conductive connector on the plastic sheet, said connector adapted to electrically and physically connect the substrate to circuitry external to the substrate; and a plurality of metal traces on the sheet each electrically connected between the connector and at least one of the posts.

18. The substrate of claim 17, wherein the posts are arranged in groups, with each group have a space between the posts of the respective group.

19. The substrate of said claim 17, wherein the plastic sheet includes the metal-coated plastic posts on opposing sides of the sheet.

20. The substrate of claim 19, further comprising one or more metal vias extending through the sheet, wherein the metal coating of at least one post on one side of the sheet is electrically connected with the metal coating of at least one post on the opposite side of the sheet through said one or more of the vias.

21. An integrated circuit package comprising:

a plastic body having a first side, an opposite second side, and a plurality of metal-coated plastic posts each extending integrally from the body; and an integrated circuit mounted on the second side of the body and electrically coupled to the metal coating of at least some of the posts, wherein at least some of said posts are on the second side of the body outward of said integrated circuit.

22. The package of claim 21, wherein the body includes a recess and the integrated circuit is disposed in the recess.

23. The package of claim 21, further comprising an enclosure coupled to the plastic body and covering the integrated circuit.

24. The package of claim 21, wherein the body includes opposed first and second sides, and the posts extend from both of the first and second sides.

25. The package of claim 24, wherein the integrated circuit is electrically coupled to at least some of the posts of both the first and second sides of the body.

26. The package of claim 25, wherein the posts of the first side are arranged in a first pattern and the posts of the second side are arranged in a second pattern different from the first pattern.

27. The package of claim 24, wherein at least three posts of the first side of the body define an opening between them, and at least one post of the second side of the body is opposite said opening.

28. An integrated circuit package comprising:

a plastic body having opposed first and second sides, and a plurality of metal-coated plastic posts each extending integrally from both the first and second sides of the body;

an integrated circuit mounted on the second side of the body and electrically coupled to the metal coating of at least some of the posts of both the first and second sides of the body; and wherein at least some of the posts are on the second side of the body outward of said integrated circuit.

29. The package of claim 28, wherein at least three posts of the first side of the body define an opening between them, and at least one post of the second side of the body is opposite said opening.

30. The package of claim 28, wherein the posts of the first side are arranged in a first pattern and the posts of the second side are arranged in a second pattern different from the first pattern.

31. The package of claim 28, further comprising an enclosure covering the integrated circuit and coupled to the body.

32. An integrated circuit package comprising:

a plastic body having a first side, an opposite second side, and a plurality of metal-coated plastic posts each extending integrally from the body;

a plurality of electrically conductive traces overlying the body; and an integrated circuit mounted on the second side of the body and electrically coupled to the metal coating of at least some of the posts through at least some of the electrically conductive traces, wherein at least some of said posts are on the second side of the body outward of said integrated circuit.

33. The package of claim 32, wherein the posts extend from both the first and second sides, and one or more electrically conductive vias through the body electrically couple the metal coating of at least some of the posts from the first side to the metal coating of at least some of the posts of the second side.

34. The package of claim 32, wherein the posts extend from both the first and second sides, and the posts of the first side are arranged in a first pattern and the posts of the second side are arranged in a second pattern different from the first pattern.

35. An integrated circuit package comprising:

a plastic body having a plurality of metal-coated plastic posts each extending integrally from the body;

a plurality of electrically conductive paths each electrically connected to the metal coating of at least one post; and an integrated circuit mounted on the body and in an electrical connection with the metal coating of at least some of the posts through the electrically conductive paths, wherein the plastic body has a first side and a second side, the posts include first posts that extend integrally from the first side and second posts that extend integrally from the second side, and at least some of the electrically conductive paths are electrically connected between the metal coating of at least one first post and one second post, wherein the first posts are arranged in a plurality of groups, with each group including a plurality of first posts with space between the first posts of the group, and wherein the second posts are sized and located so that a second post of a similar package would snugly fit in each said space, thereby forming a metal-to-metal electrical connection with at least one of the first posts of the respective group.

36. An integrated circuit package comprising:

a plastic body having a plurality of metal-coated plastic posts each extending integrally from the body; and an integrated circuit mounted on the body and electrically coupled to the metal coating of at least some of the posts, wherein the body includes opposed first and second sides, and the posts extend from both of the first and second sides, and wherein at least three posts of the first side of the body define an opening between them, and at least one post of the second side of the body is opposite said opening.

* * * * *